US012658279B2

(12) United States Patent
Park et al.

(10) Patent No.: US 12,658,279 B2
(45) Date of Patent: Jun. 16, 2026

(54) MEMORY SYSTEMS AND DEVICES HAVING ENHANCED COLUMN REPAIR CAPABILITY AND METHODS OF OPERATING SAME

(71) Applicant: Samsung Electronics Co., Ltd., Suwon-si (KR)

(72) Inventors: Won Hui Park, Suwon-si (KR); Ki-Ho Hyun, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 72 days.

(21) Appl. No.: 18/670,883

(22) Filed: May 22, 2024

(65) Prior Publication Data

US 2025/0157566 A1 May 15, 2025

(30) Foreign Application Priority Data

Nov. 10, 2023 (KR) ........................ 10-2023-0155525

(51) Int. Cl.
*G11C 29/00* (2006.01)

(52) U.S. Cl.
CPC ............ *G11C 29/76* (2013.01); *G11C 29/787* (2013.01); *G11C 29/789* (2013.01)

(58) Field of Classification Search
CPC ..... G11C 29/76; G11C 29/787; G11C 29/789; G11C 29/838
See application file for complete search history.

(56) References Cited

U.S. PATENT DOCUMENTS

| | | | |
|---|---|---|---|
| 6,603,689 B2 | 8/2003 | Kato et al. | |
| 7,116,590 B2 | 10/2006 | Blodgett | |
| 7,376,025 B2 | 5/2008 | Merritt et al. | |
| 9,082,511 B2 | 7/2015 | Lai | |
| 2016/0300627 A1* | 10/2016 | You | G11C 29/76 |
| 2017/0256326 A1* | 9/2017 | You | G06F 11/0793 |
| 2019/0348140 A1* | 11/2019 | Cho | G11C 11/4087 |

FOREIGN PATENT DOCUMENTS

| | | |
|---|---|---|
| KR | 930003163 A | 2/1993 |
| KR | 0177782 B1 | 4/1999 |
| KR | 20060002502 A | 1/2006 |
| KR | 20060022362 A | 3/2006 |

* cited by examiner

*Primary Examiner* — Mohammed A Bashar
(74) *Attorney, Agent, or Firm* — Wolf, Greenfield & Sacks, P.C.

(57) ABSTRACT

A memory device includes a memory cell array having a plurality of normal memory cells and a plurality of redundant memory cells therein, a fuse array configured to store an address and a master bit of a defective first memory cell therein, and a column decoder configured to select among a plurality of column select lines associated with the normal memory cells and a plurality of spare column select lines associated with the redundant memory cells. The column decoder has a first column repair circuit therein, which includes: (i) a first latch array having a plurality of latch elements therein, which are configured to store a column address of the defective first memory cell, and (ii) first compare logic configured to compare outputs of the plurality of latch elements with an external column address, and generate a first enable signal that indicates whether or not to repair the defective first memory cell, in response to said compare.

20 Claims, 15 Drawing Sheets

MEMORY SYSTEMS AND DEVICES HAVING ENHANCED COLUMN REPAIR CAPABILITY AND METHODS OF OPERATING SAME

REFERENCE TO PRIORITY APPLICATION

This application claims priority under 35 U.S.C. § 119 from Korean Patent Application No. 10-2023-0155525, filed Nov. 10, 2023, the disclosure of which is hereby incorporated herein by reference.

BACKGROUND

The present disclosure relates to integrated circuit devices and, more particularly, to integrated circuit memory systems and devices and methods of operating the same.

A memory device such as a dynamic random access memory (DRAM) is typically configured to have multiple memory banks therein, with each bank including a large number of memory cells, and each memory cell including a cell "access" transistor and a cell capacitor (for storing data). During operation, one or memory cells within a bank may become defective due to various reasons, and such defects may preclude the memory device from functioning properly and thereby reduce the lifespan of the memory device.

As an integration level of a memory device increases, the probability that one or more defects within the memory device may occur increases. Treating an entirety of a memory device containing only a small number of defective cells as a defective product and discarding the same may be an inefficient processing scheme that lowers overall product yield. Accordingly, a scheme of increasing product yield by replacing the defective cells with separate memory cells provided within the memory device is commonly used. In other words, in order to solve a situation in which the chip does not operate normally when a defect occurs in the memory cell, an extra memory cell is activated, and the defective memory cell is repaired (i.e., replaced) with the extra memory cell. As will be understood by those skilled in the art, the extra memory cells are typically referred to as redundant memory cells; and, a circuit involved in this repair operation is typically referred to as a repair circuit.

The greater the number of redundant memory cells within a memory device, the higher the yield of the memory device or system. However, as the number of the redundant cells increases, a significant increase in a size of the repair circuit may place a burden on a layout and chip area. Therefore, it would be advantageous to have a repair scheme to improve product yield, while minimizing the size of the repair circuit therein.

SUMMARY

A technical purpose of the present disclosure is to provide a memory device with improved efficiency and a method for operating the memory device.

According to some embodiments of present disclosure, and to achieve the technical purpose, a memory device is provided that includes: a memory cell array including a plurality of normal memory cells, and a plurality of redundant memory cells for replacing a defective memory cell among the plurality of normal memory cells, a fuse array configured to store therein an address and a master bit of a defective first memory cell, and a column decoder configured to select a plurality of column select lines and a plurality of spare column select lines. The column decoder may include a first column repair circuit having a first latch array therein, which includes a plurality of latch elements configured to store therein a column address of the defective first memory cell, and a first compare logic configured to compare outputs of the plurality of latch elements with an external column address. The first compare logic may be configured to generate a first enable signal, based on the outputs of the plurality of latch elements, and this first enable signal may indicate whether to repair the defective first memory cell.

According to additional embodiments of present disclosure, there is provided a method of operating a memory device, which includes: transmitting a column address of a defective first memory cell stored in a fuse array to a first latch array of a first column repair circuit, performing a NOR operation on an output of the first latch array and outputting a first enable signal based on the NOR operation result, comparing the output of the first latch array with an external column address and outputting a first address match signal based on the comparing result, and performing a NOR operation on the first enable signal and the first address match signal and outputting a first column repair signal based on the NOR operation result.

According to further embodiments of present disclosure, a memory system is provided that includes a memory controller configured to transmit an address of each of read data and write data to a memory device; and, the memory device is configured to repair a defective normal memory cell using a redundant memory cell. The memory device includes: a memory cell array including a plurality of normal memory cells and a plurality of redundant memory cells for replacing a defective memory cell among the plurality of normal memory cells, a fuse array configured to store therein an address and a master bit of a defective first memory cell, an address register configured to receive an address from the memory controller and transmit an external column address to a column decoder, and a column decoder configured to select a plurality of column select lines and a plurality of spare column select lines. The column decoder may include a first column repair circuit including a first latch array including a plurality of latch elements, and these latch elements are configured to store therein a column address of the defective first memory cell. First compare logic may also be provided, which is configured to compare outputs of the plurality of latch elements with the external column address. The first compare logic is also configured to generate a first enable signal based on the outputs of the plurality of latch elements, and this first enable signal indicates whether to repair the defective first memory cell.

BRIEF DESCRIPTION OF DRAWINGS

The above and other aspects and features of the present disclosure will become more apparent by describing in detail some embodiments thereof with reference to the attached drawings, in which:

FIGS. 3 to 6 are block diagrams for illustrating a repair operation according to some embodiments;

FIG. 9 and FIG. 10 are block diagrams for illustrating a repair operation according to some embodiments;

FIG. 13 is a diagram for illustrating an effect of the present disclosure according to some embodiments;

DETAILED DESCRIPTIONS

Figure 1:
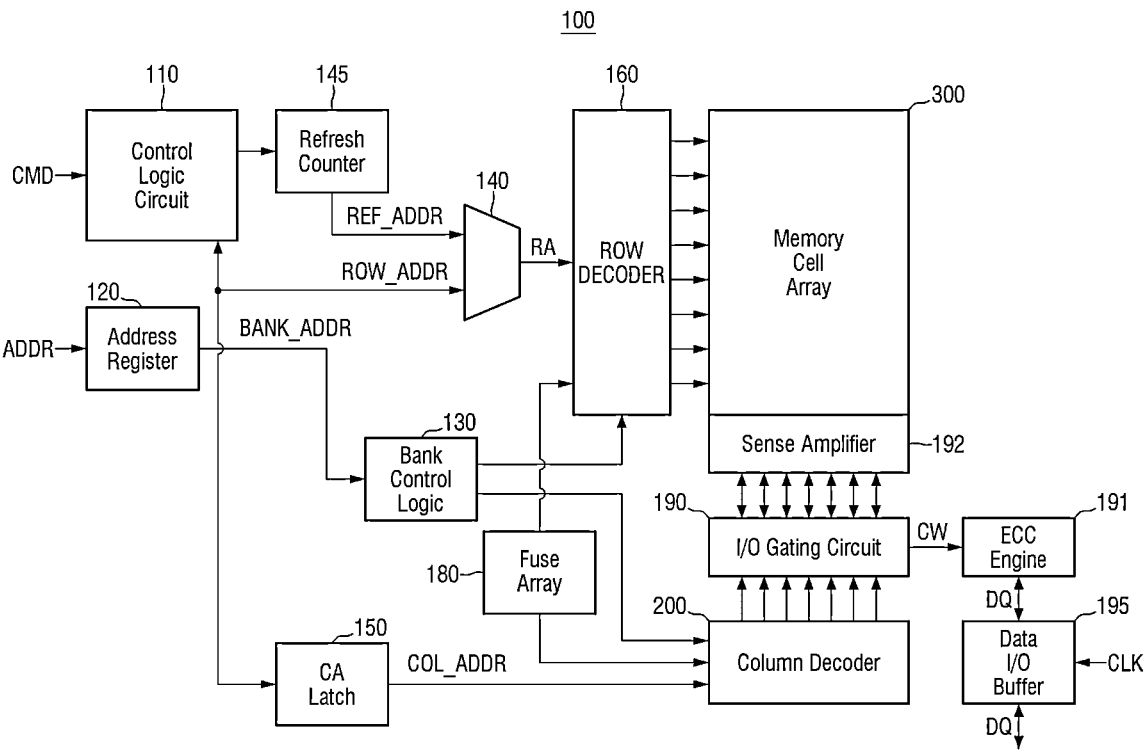
FIG. 1 is a block diagram of a memory device according to some embodiments.

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprising", "including", "having" and variants thereof, when used in this specification, specify the presence of stated features, steps, operations, elements, and/or components, but do not preclude the presence or addition of one or more other features, steps, operations, elements, components, and/or groups thereof. In contrast, the term "consisting of" when used in this specification, specifies the stated features, steps, operations, elements, and/or components, and precludes additional features, steps, operations, elements and/or components.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram of a memory device according to some embodiments. Referring to FIG. 1, a memory device 100 may include a control logic circuit 110, an address register 120, a bank control logic circuit 130, a row address multiplexer 140, a refresh counter 145, a column address latch 150, a row decoder 160, a fuse array 180, a column decoder 200, a memory cell array 300, a sense amplifier 192, an input/output gating circuit 190, an ECC engine 191, a data input/output buffer 195, etc.

The memory cell array 300 may include a plurality of memory array banks. The row decoder 160, column decoder 200 and sense amplifier 192 may be connected to the memory array banks. As will be understood by those skilled in the art, the memory cell array 300 may include a plurality of word lines, a plurality of bit lines, and a plurality of memory cells respectively disposed at points where the word lines and the bit lines intersect each other.

The control logic circuit 110 may receive a command signal CMD from an external source and control various components within the memory device 100. The address register 120 may receive an address ADDR from an external source. The address ADDR may include a bank address BANK_ADDR, a row address ROW_ADDR, and a column address COL_ADDR. The address register 120 may provide the bank address bank address BANK_ADDR to the bank control logic circuit 130. The address register 120 may provide the row address ROW_ADDR to the row address multiplexer 140. The address register 120 may provide the column address COL_ADDR to the column address latch 150.

The bank control logic circuit 130 may generate a bank control signal in response to the bank address BANK_ADDR. The bank row decoder 160 may be activated in response to the bank control signal. Furthermore, the column decoder 200 may be activated in response to the bank control signal corresponding to the bank address BANK_ADDR.

The row address multiplexer 140 may receive the row address ROW_ADDR from the address register 120 and a refresh row address REF_ADDR from the refresh counter 145. The row address multiplexer 140 may select either the row address ROW_ADDR or the refresh row address REF_ADDR and output the selected one as a row address RA. The row address RA may be transmitted to the row decoder 160. The refresh counter 145 may sequentially output the refresh row address REF_ADDR under control of the control logic circuit 110.

The row decoder 160 activated by the bank control logic circuit 130 may decode the row address RA output from the row address multiplexer 140 and activate a word line corresponding to the row address RA. For example, the row decoder 160 may apply a word line driving voltage to the word line corresponding to the row address RA.

The column address latch 150 may receive the column address COL_ADDR from the address register 120 and temporarily store the received column address COL_ADDR therein. The column address latch 150 may gradually increase the received column address COL_ADDR in a burst mode. The column address latch 150 may provide the temporarily stored column address COL_ADDR or the gradually increased column address COL_ADDR to the column decoder 200.

The fuse array 180 may store therein an address of a defective memory cell found in a wafer test or package test process. Specifically, in the wafer test or package test process, whether each of all memory cells operates normally may be determined, and an address of a detected defective memory cell may be stored in the fuse array 180. The fuse array 180 may include a plurality of fuse elements. Each of the plurality of fuse elements may be a non-volatile memory in which data can be stored therein even when power supply thereto is cut off.

Each of the plurality of fuse elements of the fuse array 180 may be implemented using each of various non-volatile memories such as an electrically programmable fuse, a laser programmable fuse, an anti-fuse, a flash memory, etc. The laser programmable fuse may be manufactured in a short-circuited state relative to an external circuit and may be brought into an open state relative to the external circuit by laser to store the address of the defective memory cell therein. The anti-fuse may be manufactured in an open state relative to the external circuit, and may be brought into a short-circuited state relative to the external circuit via blowing thereof (applying high voltage thereto) to store the address of the defective memory cell therein. The fuse array 180 may transmit column address information of the defective memory cell to the column decoder 200 when the memory device 100 operates and may transmit row address information of the defective memory cell to the row decoder 160.

Among the column decoders 200, the column decoder 200 activated by the bank control logic circuit 130 may activate the sense amplifier 192 corresponding to the column address COL_ADDR and the bank address BANK_ADDR via a corresponding input/output gating circuit 190 to select a column select line CSL corresponding to the column address COL_ADDR, and select a bit line BL1 to BLk corresponding to the selected column select line CSL. The column decoder 200 as described below refers to the column decoder 200 activated by the bank control logic circuit 130. The input/output gating circuit 190 may include a circuit for gating input/output data, an input data mask logic, read-out data latches for storing therein data output from the memory cell array 300, and write drivers for writing data to the memory cell array 300.

A codeword CW read-out from the bank memory array of the memory cell array 300 may be detected by the sense amplifier 192 corresponding to the bank memory array. Furthermore, the codeword CW may be stored in the read-out data latch. The ECC engine 191 may perform ECC decoding on the codeword CW stored in the read-out data latch. Data DQ obtained by performing the ECC decoding on the codeword CW may be provided to an external component through the data input/output buffer 195.

The data input/output buffer 195 may provide the data DQ to the ECC engine 191 based on a clock signal CLK in a write operation. The data input/output buffer 195 may provide the data DQ provided from the ECC engine 191 to an external component based on a clock signal CLK in a read-out operation. The memory cell array 300 may be connected to the sense amplifier 192. Each of the row decoder 160 and the column decoder 200 may be connected to the memory cell array 300 and the sense amplifier 192.

Figure 2:
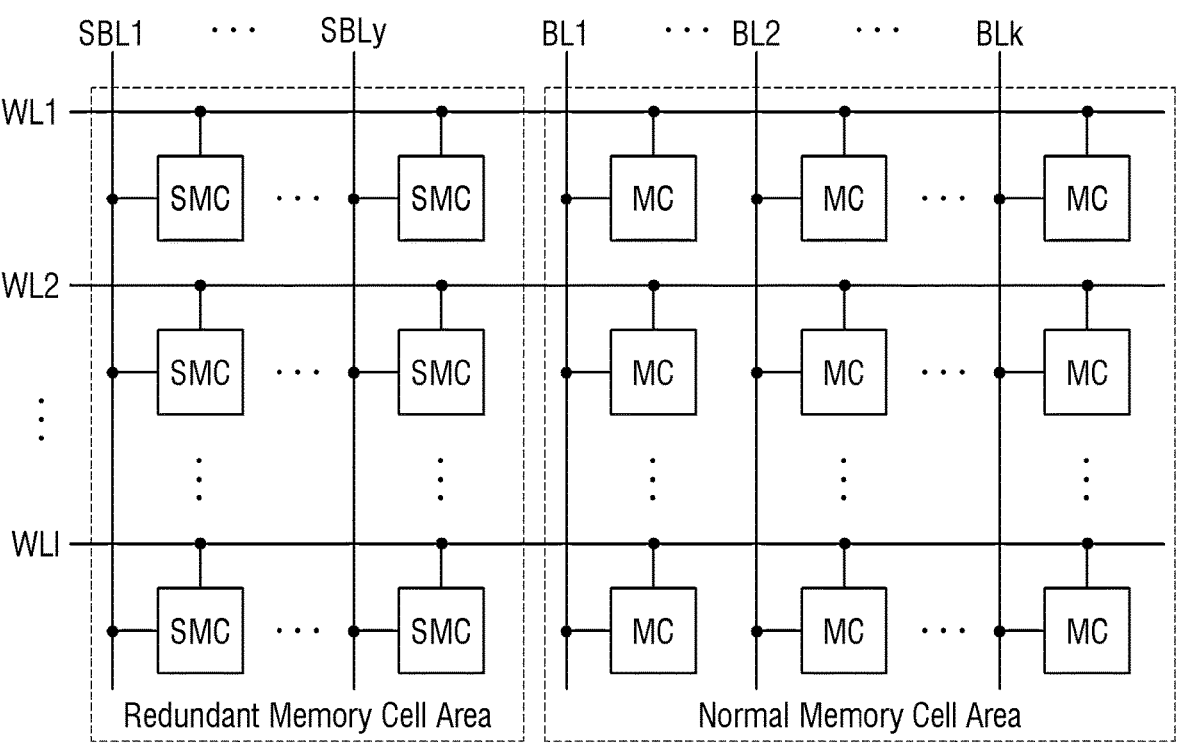
FIG. 2 is an enlarged view of a memory cell array in FIG. 1.

FIG. 2 is an enlarged view of an embodiment of the memory cell array in FIG. 1. Referring to FIG. 2, a memory cell area may be connected to a plurality of word lines WL0 to WL1 and a plurality of bit lines BL0 to BLk. A redundant memory cell area may be connected to the plurality of word lines WL0 to WL1 and a plurality of spare bit lines SBL0 to SBLy. In this regard, each of l, k, and y may be a non-negative integer, and may be determined based on characteristics (e.g., a capacitance of the bit line, an area, etc.) of the memory device, a specification thereof, etc., and "y" means a total number of spare bit lines. As will be understood by those skilled in the art, as the value of y increases, a yield of the memory device may be improved, but a layout area of the memory device may increase.

Figure 3:
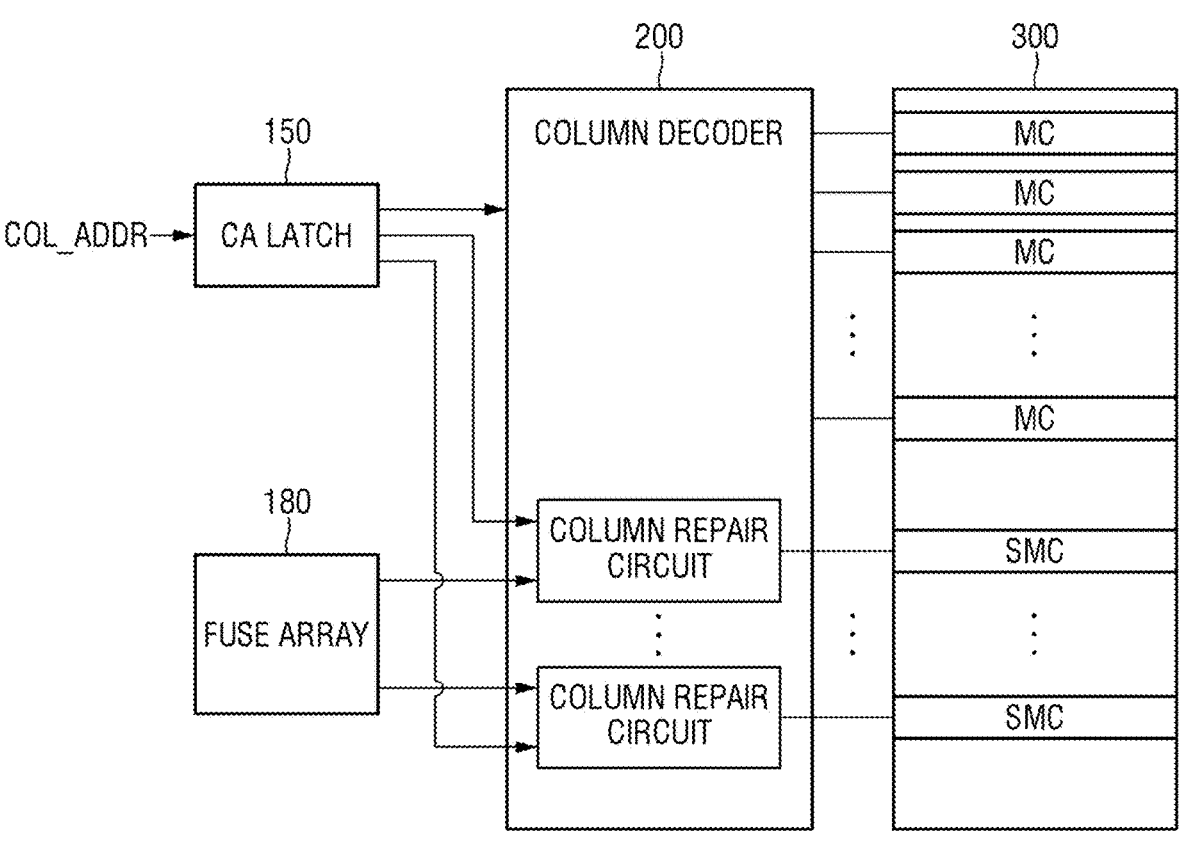

FIG. 3 is a block diagram for illustrating a repair operation according to some embodiments. Referring to FIG. 3, the column decoder 200 may receive an external column address from the column address latch 150. Specifically, the column decoder 200 may include a plurality of column repair circuits, and each of the plurality of column repair circuits may receive the external column address CA<9:4> that includes, for example, 6 bits from the column address latch 150. FIG. 3 shows two column repair circuits, but this is merely one example of at least one column repair circuit.

The column decoder 200 may select the plurality of bit lines BL0 to BLk by selecting a plurality of column select lines CSL0 to CSLk. The column decoder may select the plurality of spare bit lines SBL0 to SBLy by selecting a plurality of spare column select lines SCSL0 to SCSLy. The column decoder 200 may receive the column address of the defective memory cell from the fuse array 180.

Figure 4:
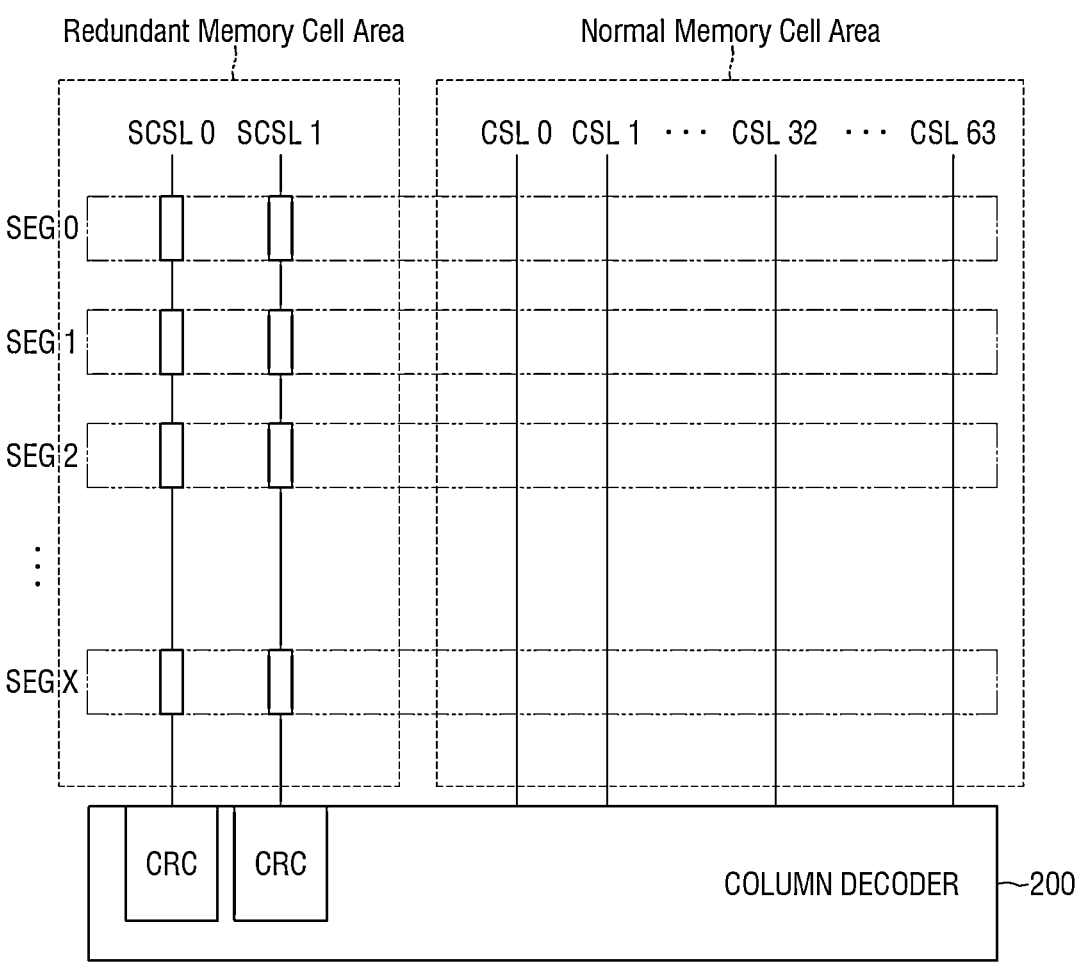

FIG. 4 is a block diagram for illustrating a repair operation according to some embodiments. Referring to FIG. 4, two spare column select lines and 64 column select lines are shown. Each of two spare column select lines and the 64 column select lines may be divided into segments SEG 0 to SEG X (X is a non-negative integer). The column select line may be repaired on a segment basis. The column repair method on a segment basis will be described in detail below.

Figure 5:
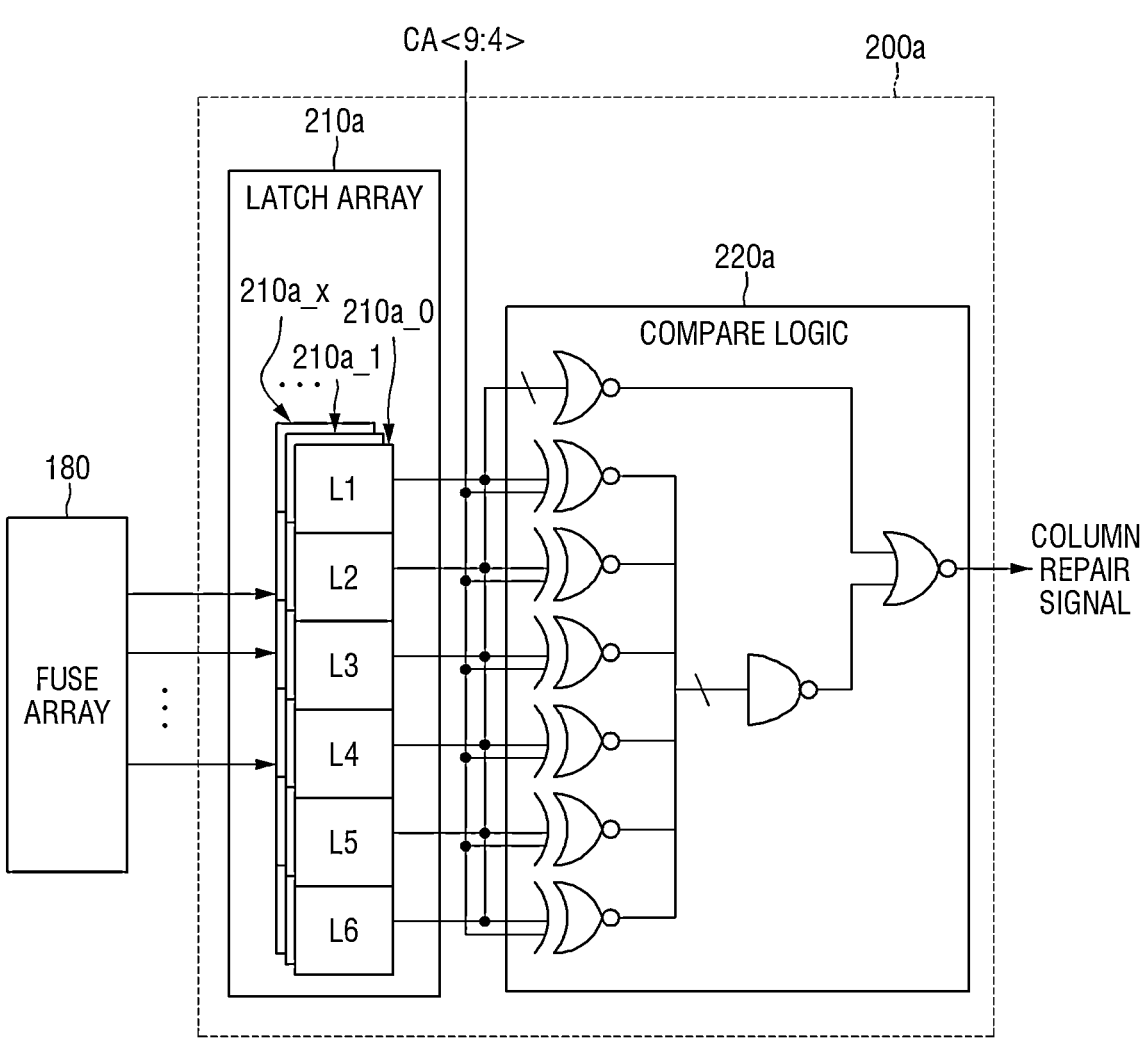
Figure 6:
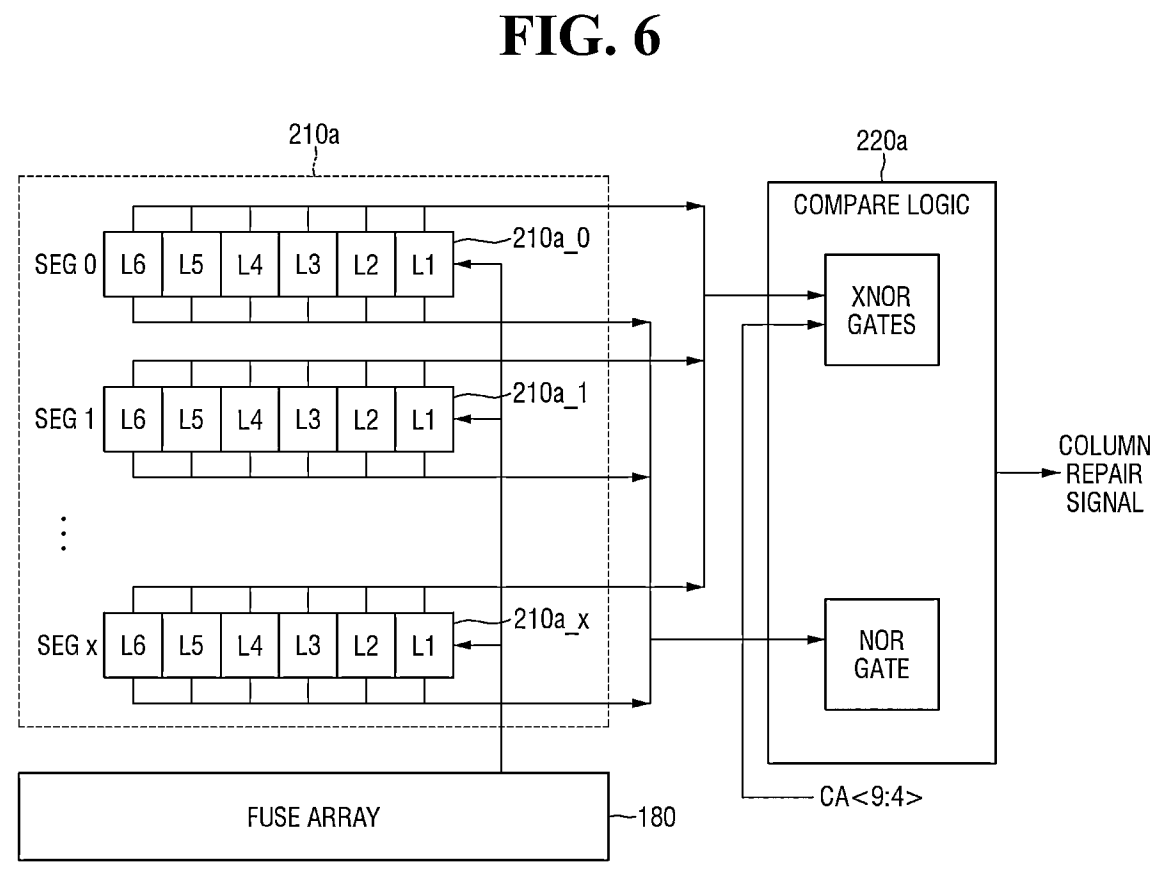

FIG. 5 and FIG. 6 are block diagrams for illustrating a repair operation according to some embodiments. Referring to FIG. 5 and FIG. 6, the column decoder 200 may include a plurality of column repair circuits. FIG. 5 shows a first column repair circuit 200a. The first column repair circuit 200a may include a first latch array 210a and a first compare logic 220a. The first latch array 210a may include a plurality of latch sets 210a_0 to 210a_x respectively corresponding to the segments. Thus, the number of the latch sets 210a_0 to 210a_x may be equal to the number of the segments. The first latch array 210a may receive the column address of the defective memory cell from the fuse array 180. Specifically, referring to FIG. 6, the latch set 210a_0 corresponding to the segment 0 of each of the plurality of column select lines may receive the column address of the defective memory cell in the segment 0 of each of the plurality of column select lines from the fuse array 180.

Each of the plurality of latch sets 210a_0 to 210a_x of the first latch array 210a may include a plurality of latch elements L1 to L6. Each of the plurality of latch elements may be embodied as a volatile memory cell such as SRAM (Static Random Access Memory). However, an embodiment is not limited thereto and each of the plurality of latch elements may have a memory type different therefrom. Upon receiving the column address of the defective memory cell from the fuse array 180, each of the plurality of latch elements may receive the column address of the defective memory cell by 1 bit at a time, and latch the received column address. FIG. 5 shows six latch elements. However, the number of latch elements is not limited thereto and the number of latch elements may be smaller than or greater than 6.

The first compare logic 220a may receive the column address of the defective memory cell from each of the plurality of latch sets of the first latch array 210a and output a first enable signal and a first address match signal, based on the received column address. For example, the first compare logic 220a may receive the column address of the defective memory cell stored in each of the plurality of latch elements from each of the plurality of latch set 210a_0 to 210a_x and compare the received column address with an external column address at a rate corresponding to one bit at a time, and may output the first address match signal based on the comparing result. The first compare logic 220a may receive the column address of the defective memory cell from each of the plurality of latch sets 210a_0 to 210a_x, and may perform a NOR operation on all of the received bits, and may output the first enable signal based on the NOR operation result. The first compare logic 220a may perform a NOR operation on the first address match signal and the first enable signal, and may output a first column repair signal based on the NOR operation result.

Figure 7:
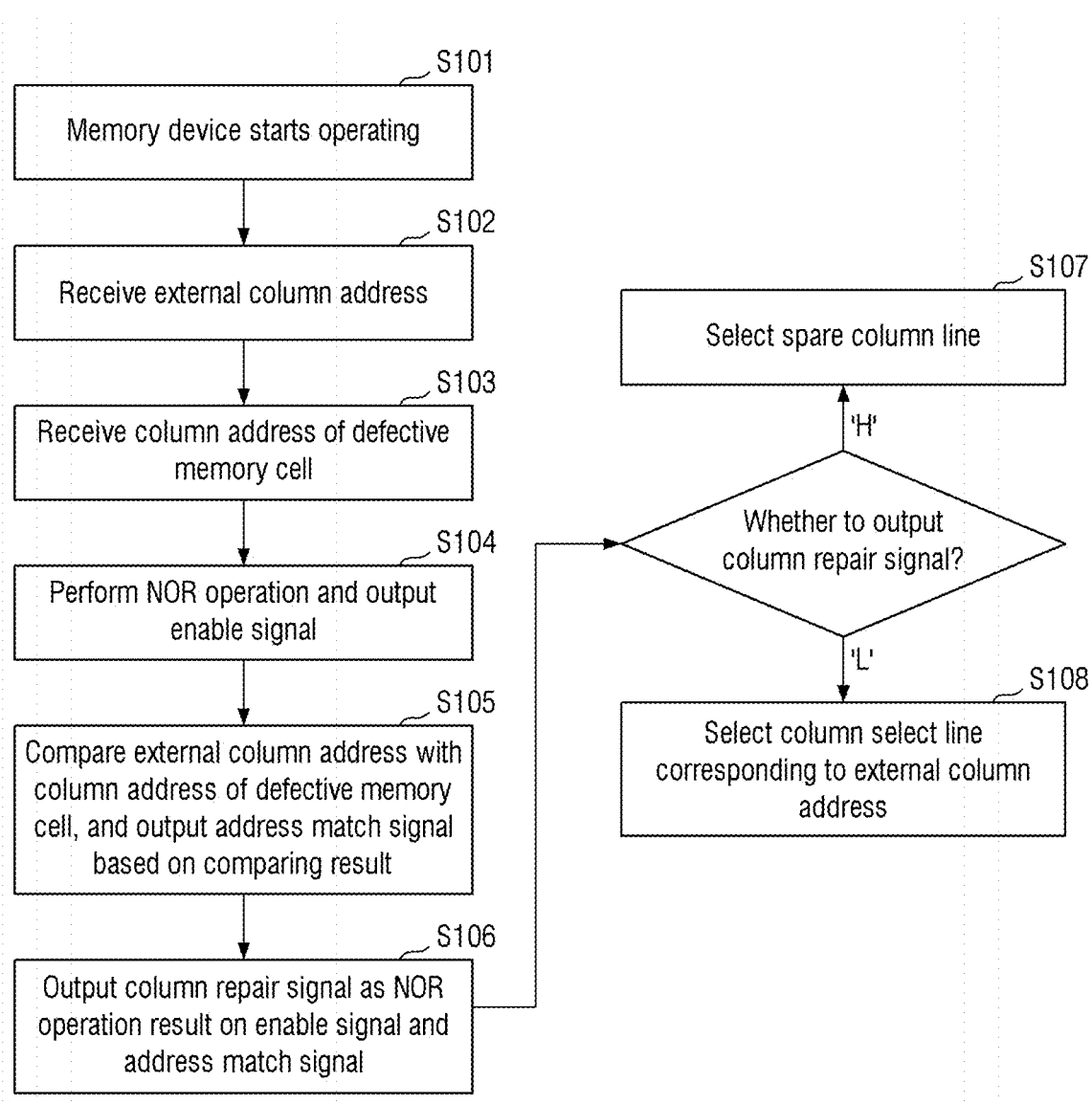
FIG. 7 is a flow chart for illustrating a repair operation according to some embodiments.

FIG. 7 is a flowchart for illustrating a repair operation according to some embodiments. When the memory device starts operating, a repair operation of the defective memory cell begins in S101. The column decoder 200 receives the external column address from the column address latch 150 in S102 and receives the column address of the defective memory cell from the fuse array 180 in S103, as described hereinabove.

An output of each latch array is subjected to a NOR operation and an enable signal is output based on the NOR operation result in S104. Thus, as one example, if the output of the latch array is '000000', then 'H' may be output based on the NOR operation result thereon. However, if a '1' is present in at least one bit in the output of the latch array, 'L' may be output based on the NOR operation result thereon.

The external column address is compared with the column address of the defective memory cell, and an address match signal is output based on the comparing result in S105. For example, in response to that, based on a comparing result between the output of the latch array and the external column address, which may be done bit by bit, a match between each of the bits thereof may yield a 'L' output; however, a mismatch between one or more bits may yield an 'H' output. This may be obtained by performing a NAND operation on all outputs of XNOR gates.

The column repair signal is output as a NOR operation result on the enable signal and the address match signal in S106. For example, if '1' is present at least in one bit in the output of the latch array and the output of the latch array matches the external column address, the enable signal is 'L' and the address match signal is 'L'. Thus, based on the NOR operation result on the enable signal and the address match signal, the column repair signal may be output as 'H'. If the output of the latch array is '000000' or the output of the latch array and the external column address do not match each other, the column repair signal may be outputted as 'L'.

If the column repair signal is 'H', the column repair circuit may transmit a column select line disable signal and a spare column select line enable signal, which correspond to the column address, to the column decoder 200. As a result, the column decoder 200 selects a spare column select line in S107. In contrast, if the column repair signal is 'L', the column repair circuit may transmit a column select line enable signal and a spare column select line disable signal, which correspond to the external column address, to the column decoder 200. As a result, the column decoder 200 selects the column select line corresponding to the external column address in S108.

The repair operation may be performed repeatedly a number of times corresponding to the number of the divided segments. Specifically, when the repair operation corresponding to SEG 0 has been completed, the repair operation corresponding to SEG 1 may begin to be performed. After the repair operation has been repeated the number of times corresponding to the number of the divided segments, the repair operation may be completely terminated.

Figure 8:
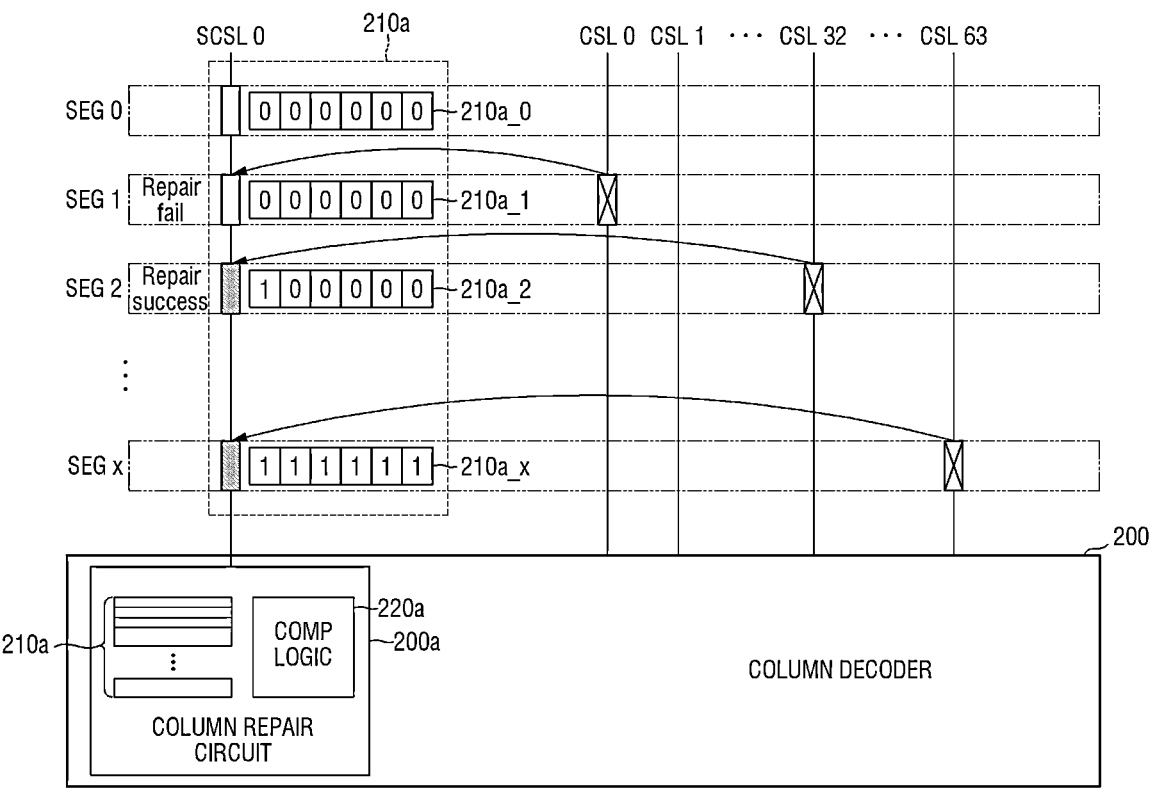
FIG. 8 is a diagram for illustrating an effect of the present disclosure according to some embodiments.

FIG. 8 is a diagram for illustrating an effect of the present disclosure according to some embodiments, where any column repair circuit may include a latch array and compare logic and the latch array may include a plurality of latch sets; each latch set may include a plurality of latch elements that store therein the column address and a master latch element that determines whether or not to perform the repair operation. The master latch element may receive a master bit that determines whether or not to perform the repair operation as an input, latch the master bit, and output an enable signal based on the master bit. For example, if a memory cell corresponding to CSL (column select line) 0 in SEG 0 of the memory cells of the memory cell array 300 is defective, a master bit '0' indicating performing the repair operation and a column address '000001' of CSL 1 may be stored in the latch set corresponding to SEG 1 in the latch array.

When any column repair circuit executes the repair operation on any segment, there may be no defective memory cell in the segment, or the column addresses of all defective memory cells in the segment may be stored in a latch array of another column repair circuit. In this case, the latch set corresponding to the segment may store and latch a default value. For example, if the default value is '000000', the latch set may latch and output '000000' as the default value. In this case, the column repair circuit does not need to perform the repair operation. However, if the column repair circuit determines that the memory cell with the column address '000000' among the memory cells is defective, then when '000000' as the external column address is input thereto, the column repair circuit may perform the repair operation. Accordingly, if the default value of '000000' is input to the relevant latch set, the master bit of 'H' together therewith may be input thereto, such that the column repair circuit does not operate, thereby preventing the memory device from malfunctioning.

In the above embodiment, each of the plurality of latch sets further includes the master latch element, which may further increase a layout area occupied by the latch elements. As described previously, each of the plurality of latch elements may be embodied as a volatile memory element such as SRAM (Static Random Access Memory). The SRAM has an access speed which is greater, by at least 100 times, than that of DRAM (Dynamic Random Access Memory). But, because the SRAM has a relatively complex structure and takes up a lot of layout space, it may be difficult to increase an integration level thereof. In other words, the master latch elements included in the plurality of latch sets may occupy a lot of space within a chip.

In some embodiments of the present disclosure, the master latch element may be absent, and the output of the latch element storing therein the column address of the defective memory cell may be subjected to the NOR operation, and the enable signal may be output based on the NOR operation result without requiring a master latch element. Because the master latch element is absent, the space occupied by the plurality of latches may be reduced, and this reduction may advantageously reduce an overall size of the memory device. This reduction in size may also mean that the number of chips that can be manufactured per wafer may be increased, to thereby increase wafer yield.

In some embodiments of the present disclosure, the master latch element is absent. Thus, if the column address of the defective memory cell is '000000', the NOR operation may be performed on the output from the latch element, and thus, 'H' is output as the NOR operation result. Thus, the corresponding memory cell cannot be repaired.

Figure 9:
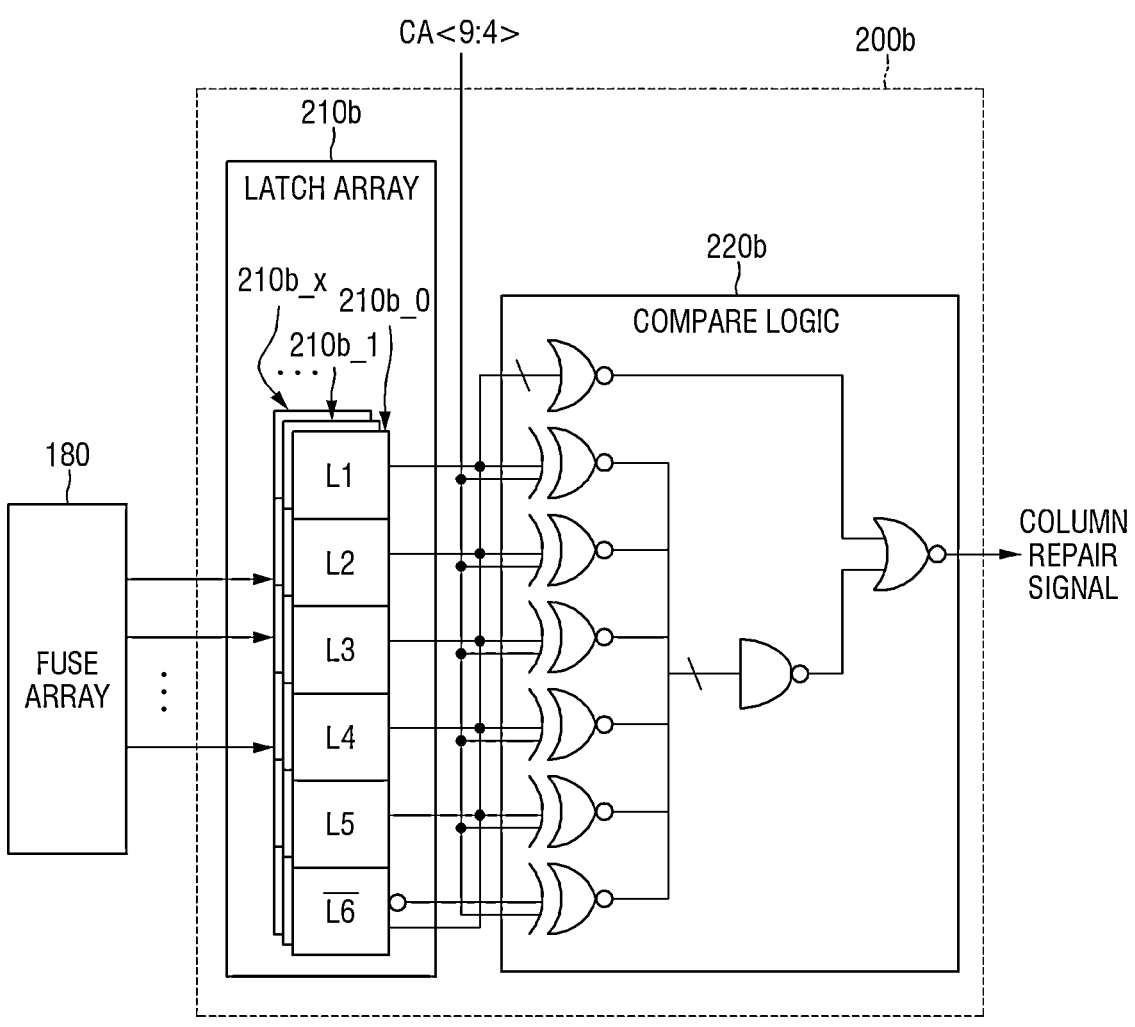
Figure 10:
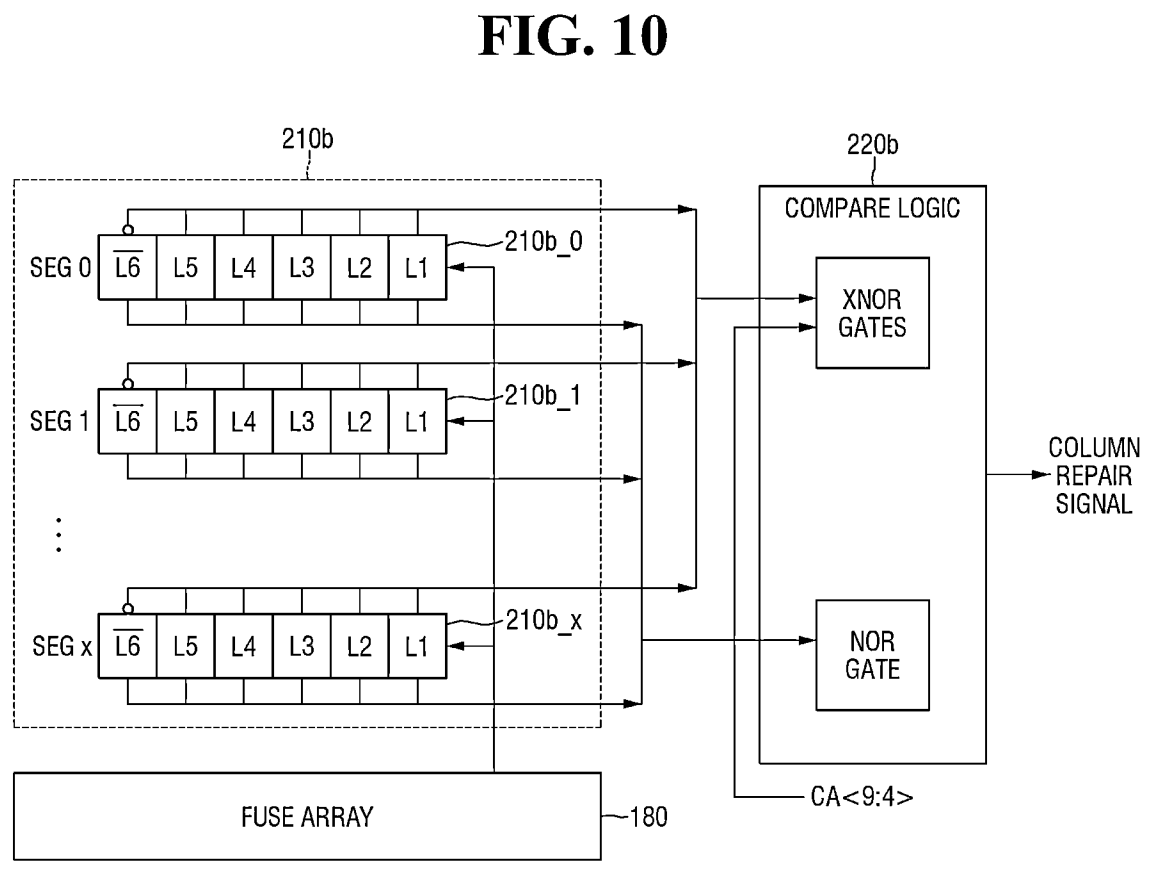

FIG. 9 and FIG. 10 are block diagrams for illustrating a repair operation according to some embodiments. Referring to FIG. 9 and FIG. 10, a second column repair circuit (200b) is shown. A second column repair circuit 200b may include a second latch array 210b and a second compare logic 220b. The second latch array may include a plurality of latch sets

210*b*_0 to 210*b*_x that correspond to the segments. The number of the plurality of latch sets 210*b*_0 to 210*b*_x is equal to the number of the segments. The second latch array 210*b* may receive the column address of the defective memory cell from the fuse array 180. Each of the plurality of latch sets 210*b*_0 to 210*b*_x of the second latch array 210*b* may include a plurality of latch elements L1 to L6.

Unlike the first column repair circuit 200*a* as shown in FIG. 5, the latch element L6 which receives the most significant bit among the plurality of latch elements of each of the plurality of latch set 210*b*_0 to 210*b*_x may invert an input thereto and latch the inverted input. For example, upon receiving '101010' as the column address of the defective memory cell from the fuse array 180, the latch set may latch '001010'. In FIG. 9 and FIG. 10, it is shown that only the latch element L6 receives the most significant bit, and inverts the input thereto and latches the inverted input. However, an embodiment is not limited thereto, and each of other latch elements may also invert an input thereto and latch the inverted input.

The second compare logic 220*b* may receive the column address of the defective memory cell from each of the plurality of latch sets of the second latch array 210*b* and output a second enable signal and a second address match signal. For example, the second compare logic 220*b* may receive the column address of the defective memory cell stored in each of the plurality of latch elements of each of the plurality of latch sets 210*b*_0 to 210*b*_x therefrom and may compare the received column address with the external column address by one bit at a time, and may output the second address match signal based on the comparing result.

In this regard, unlike the first compare logic 220*a* as shown in FIG. 5 and FIG. 6, the second compare logic 220*b* should invert the output for address comparison because the latch element L6 has received the most significant bit of the column address of the defective memory cell as the input thereto and has inverted the input and has latched the inverted input.

The second compare logic 220*b* may receive the column address of the defective memory cell from each of the latch sets 210*b*_0 to 210*b*_x of the second latch array 210*b*, may perform a NOR operation on all of the received bits, and may output the second enable signal based on the NOR operation result. The second compare logic 220*b* may perform a NOR operation on the second address match signal and the second enable signal, and may output the second column repair signal based on the NOR operation result.

Figure 11:
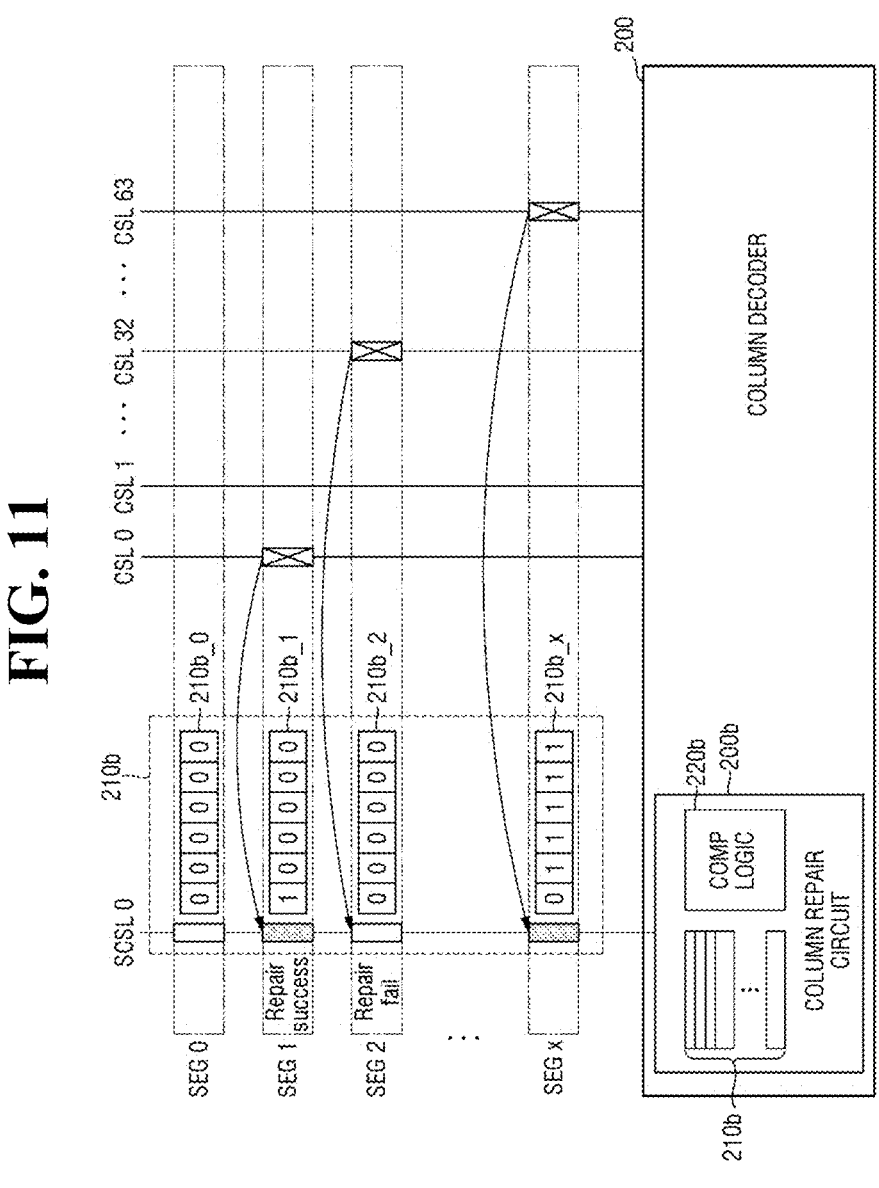
FIG. 11 is a diagram for illustrating an effect of the present disclosure according to some embodiments.

FIG. 11 is a diagram for illustrating an effect of the present disclosure according to some embodiments. As previously described, in some embodiments of the present disclosure, the master latch element may be absent, and the enable signal may be output without the master latch element. Because the master latch element is absent, the space occupied by the plurality of latches may be reduced, ultimately reducing a size of the memory device. Accordingly, the number of chips that may be manufactured per wafer may be increased, and thus the yield may be improved.

In some embodiments of the present disclosure, at least one of the plurality of latch elements included in each of the plurality of latch sets 210*b*_0 to 210*b*_x may be configured to invert the input thereto and latch the inverted input. For example, the latch element L6 receives the most significant bit of the column address of the defective memory cell, and inverts the input thereto and latches the inverted input therein. In one example, upon receiving the column address '000000' of the defective memory cell from the fuse array 180, the latch set may latch '100000'. The NOR operation may be performed thereon and thus, the enable signal of 'L' may be output based on the NOR operation result. As a result, unlike some further embodiments as disclosed in the present disclosure, even when the column address of the defective memory cell is '000000', the memory cell can be repaired.

However, upon receiving the column address '100000' of the defective memory cell from the fuse array 180, the latch set may latch '000000'. The NOR operation may be performed thereon and thus, the enable signal of 'H' may be output based on the NOR operation result. As a result, unlike some further embodiments as disclosed in the present disclosure, when the column address of the defective memory cell is '100000', the memory cell cannot be repaired.

In general, it is well known that a possibility at which the defect occurs in the memory cell in the outermost bit line or word lines is higher than that in a non-outermost bit line or word line (i.e., more interior, non-peripheral, lines). In other words, a possibility at which the defect occurs in a memory cell with a column address of '000000' may be higher than a possibility at which the defect occurs in a memory cell with a column address different therefrom. In other words, a possibility at which the defect occurs in a memory cell with a column address of '100000' may be relatively lower than a possibility at which the defect occurs in a memory cell with a column address of '000000'. The column repair circuit according to some embodiments as shown in FIG. 9 and FIG. 10 cannot repair a memory cell with a column address of '100000', but can repair a memory cell with a column address of '000000'. In other words, the memory cell with a higher defect occurrence possibility can be repaired. Thus, a yield of the memory device may be improved, and productivity thereof may be further increased.

Figure 12:
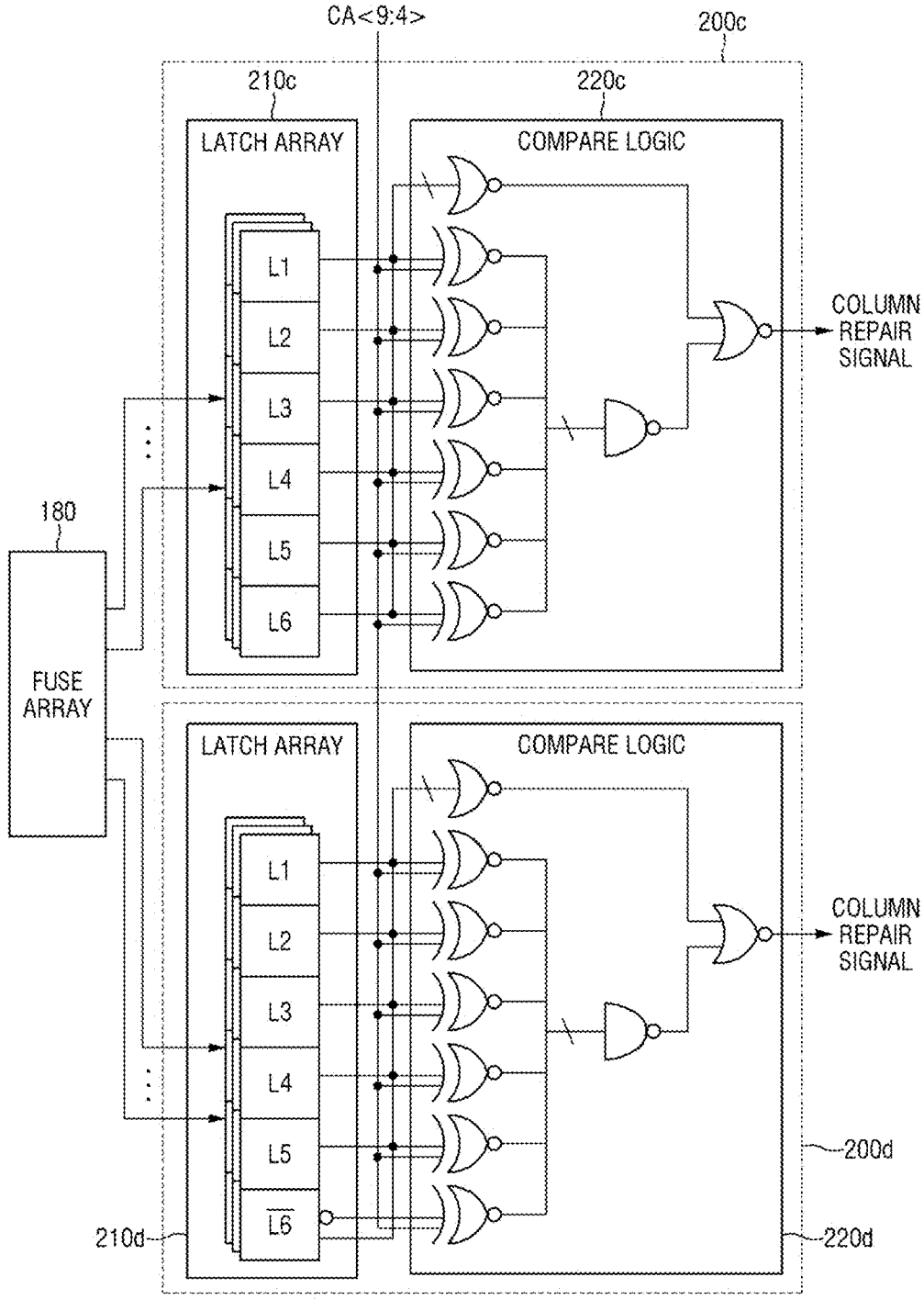
FIG. 12 is a block diagram for illustrating a repair operation according to some embodiments.

FIG. 12 is a block diagram for illustrating a repair operation according to some embodiments, which shows third and fourth column repair circuits 200*c* and 200*d*. These third and fourth column repair circuits 200*c* and 200*d* may include third and fourth latch arrays 210*c* and 210*d* and third and fourth compare logics 220*c* and 220*d*, respectively. The third and fourth latch arrays 210*c* and 210*d* may respectively include a plurality of latch sets 210*c*_0 to 210*c*_x and a plurality of latch sets 210*d*_0 to 210*d*_x. The plurality of latch sets 210*c*_0 to 210*c*_x correspond to the segments and the number of the plurality of latch sets 210*c*_0 to 210*c*_x is equal to the number of segments. The plurality of latch sets 210*d*_0 to 210*d*_x correspond to the segments and the number of the plurality of latch sets 210*d*_0 to 210*d*_x is equal to the number of segments. Each of the third and fourth latch arrays 210*c* and 210*d* may receive the column address of the defective memory cell from the fuse array 180.

For example, in the third column repair circuit 200*c*, the latch set 210*c*_0 corresponding to the segment 0 of each of the plurality of column select lines may receive the column address of the defective memory cell in the segment 0 of each of the plurality of column select lines from the fuse array 180. Each of the plurality of latch sets 210*c*_0 to 210*c*_x of the third latch array 210*c* may include a plurality of latch elements L1 to L6. Each of the plurality of latch sets 210*d*_0 to 210*d*_x of the fourth latch array 210*d* may include a plurality of latch elements L1 to L6. Each of the plurality of latch sets 210*c*_0 to 210*c*_x of the third latch array 210*c* may receive the column address of the defective memory cell received from the fuse array 180 as an input thereto, and may latch the received column address. Each of the plurality of latch sets 210*d*_0 to 210*d*_x of the fourth latch array 210*d* may include a plurality of latch elements. Unlike the third latch array, at least one of the plurality of latch elements of each of the plurality of latch sets of the fourth latch array may invert the input thereto and latch the inverted input. In other words, each of the plurality of latch sets of the fourth latch array 210*d* may receive the column address of the defective memory cell and invert at least one bit of the column address, and latch the column address.

The third compare logic 220*c* may receive the output of each of the plurality of latch sets 210*c*_0 to 210*c*_x of the third latch array 210*c* and may perform a NOR operation on the output, and may output a third enable signal, based on the NOR operation result. The fourth compare logic 220*d* may receive the output of each of the plurality of latch sets 210*d*_0 to 210*d*_x of the fourth latch array 210*d* and may perform a NOR operation on the output, and may output a fourth enable signal, based on the NOR operation result. The third compare logic 220*c* may receive the output in the non-inverted state of each of the plurality of latch sets 210*c*_0 to 210*c*_x of the third latch array 210*c* as the input thereto, compare the output with the external column address, and output a third address match signal, based on the comparing result.

The fourth compare logic 220*d* may receive the output of each of the plurality of latch sets 210*d*_0 to 210*d*_x of the fourth latch array 210*d* in which at least one bit of the column address is inverted by at least one latch element as the input thereto, and may invert the input thereto, and may latch the inverted input therein. Then, the fourth compare logic 220*d* may compare the latched inverted input with the external column address, and may output a fourth address match signal based on the comparing result.

Figure 13:
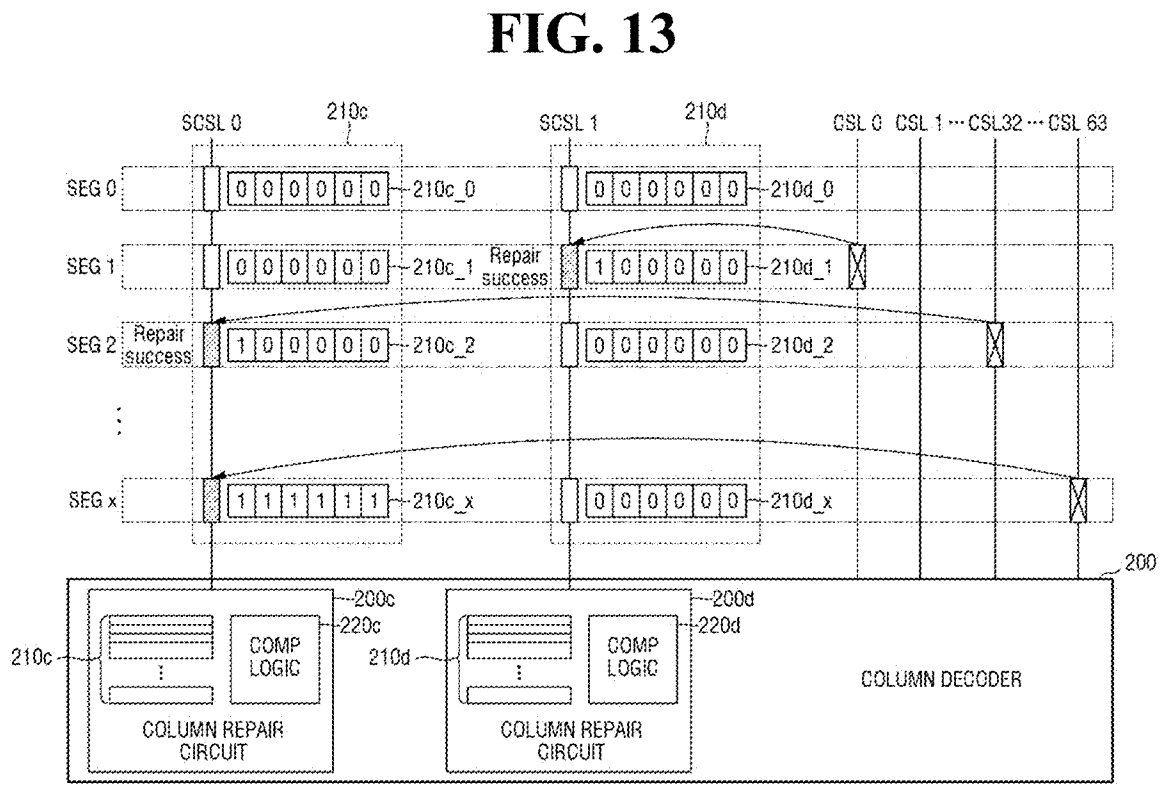

FIG. 13 is a diagram for illustrating an effect of the present disclosure according to some embodiments. Here, the third column repair circuit 200*c* and the fourth column repair circuit 200*d* may operate in a complementary manner with each other. As described previously, the third column repair circuit 200*c* may not be able to repair the defective memory cell if the column address of the defective memory cell is '000000' as shown in FIG. 8. The third column repair circuit 200*c* may be able to repair the defective memory cell if the column address of the defective memory cell is '100000' as shown in FIG. 8.

The fourth column repair circuit 200*d* may be able to repair the defective memory cell if the column address of the defective memory cell is '000000' as shown in FIG. 11. As shown in FIG. 11, if the column address of the defective memory cell is '100000', the fourth column repair circuit 200*d* cannot repair the defective memory cell. When the address of the defective memory cell found in the wafer test or package test process is stored in the fuse array 180, the address of the defective memory cell may be stored in the fuse array 180 such that the third column repair circuit 200*c* and the fourth column repair circuit 200*d* operate in a complementary manner with each other. For example, as shown in FIG. 13, it may be assumed that a defect is detected at CSL 0 in SEG 1 and a defect is detected at CSL 32 in SEG 2. During the wafer test or package test process, the column address '000000' corresponding to CSL 0 and the column address '100000' corresponding to CSL 32 along with the segment information may be stored in the fuse array 180.

The second latch set 210*d*_1 of the fourth latch array 210*d* corresponding to SEG 1 may receive '000000' from the fuse array 180 and may invert the most significant bit thereof, and thus output '100000' in the inverted state. The third latch set 210*c*_2 of the third latch array 210*c* corresponding to SEG 2 may receive '100000' from the fuse array 180.

The third and fourth column repair circuits 200*c* and 200*d* operate in the complementary manner with each other. Thus, the third column repair circuit 200*c* can repair the defective memory cell having the column address '100000' that the fourth column repair circuit 200*d* cannot repair. The fourth column repair circuit 200*d* can repair the defective memory cell having the column address '000000' that the third column repair circuit 200*c* cannot repair. In other words, the third and fourth column repair circuits 200*c* and 200*d* may operate in the complementary manner with each other to repair the defective memory cells of all column addresses.

Figure 14:
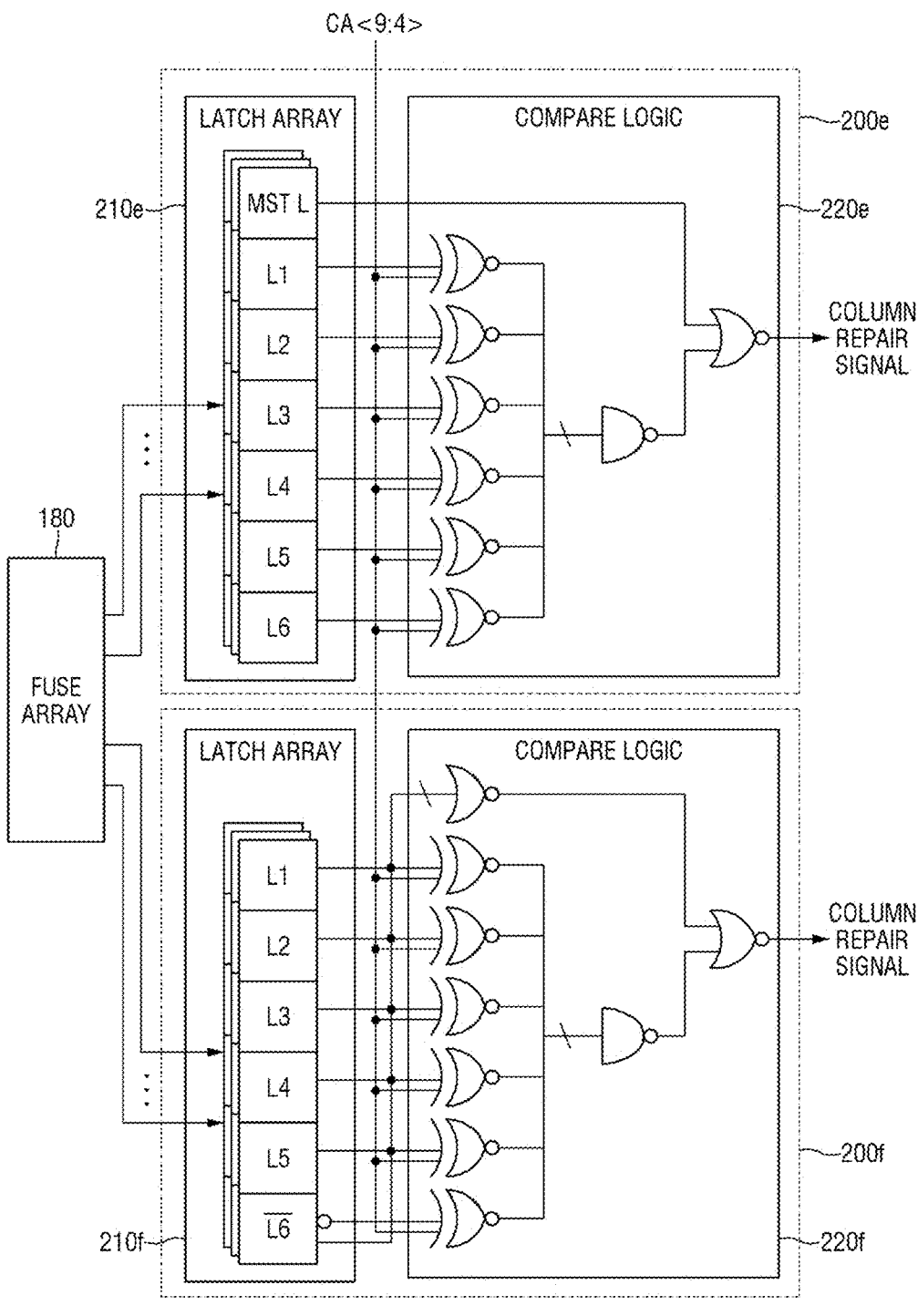
FIG. 14 is a block diagram for illustrating a repair operation according to some embodiments.

FIG. 14 is a block diagram for illustrating a repair operation according to some embodiments. In particular, FIG. 14 shows fifth and sixth column repair circuits 200*e* and 200*f*. The fifth and sixth column repair circuits 200*e* and 200*f* may include fifth and sixth latch arrays 210*e* and 210*f* and fifth and sixth compare logics 220*e* and 220*f*, respectively. The fifth and sixth latch arrays 210*e* and 210*f* may respectively include a plurality of latch sets 210*e*_0 to 210*c*_e and a plurality of latch sets 210*f*_0 to 210*f*_x. The plurality of latch sets 210*e*_0 to 210*e*_x correspond to the segments and the number of the plurality of latch sets 210*e*_0 to 210*e*_x is equal to the number of segments. The plurality of latch sets 210*f*_0 to 210*d*_f correspond to the segments and the number of the plurality of latch sets 210*f*_0 to 210*d*_f is equal to the number of segments. Each of the fifth and sixth latch arrays 210*e* and 210*f* may receive the column address of the defective memory cell from the fuse array 180.

Each of the plurality of latch sets 210*f*_0 to 210*f*_x of the sixth latch array 210*f* may include a plurality of latch elements L1 to L6. Unlike each of the plurality of latch sets 210*f*_0 to 210*f*_x of the sixth latch array 210*f*, each of the plurality of latch sets 210*e*_0 to 210*e*_x of the fifth latch array 210*e* may include not only a plurality of latch elements L1 to L6 but also a master latch element.

Each of the plurality of latch sets 210*e*_0 to 210*e*_x of the fifth latch array 210*e* may receive not only the column address of the defective memory cell from the fuse array 180 but also the master bit that determines whether to perform the repair operation. The master latch element of each of the plurality of latch sets 210*e*_0 to 210*e*_x of the fifth latch array 210*e* may receive the master bit as the input thereto and latch the master bit. Remaining latch elements except the master latch element of each of the plurality of latch sets 210*e*_0 to 210*e*_x of the fifth latch array 210*e* may receive the column address of the defective memory cell and may latch the column address.

Unlike the fifth latch array 210*e*, each of the plurality of latch sets 210*f*_0 to 210*f*_x of the sixth latch array 210*f* may include the plurality of latch elements except for the master latch element. Unlike the fifth latch array 210*e*, at least one of the plurality of latch elements of each of the plurality of latch sets of the sixth latch array 210*f* may invert the input and latch the inverted input. In other words, each of the plurality of latch sets 210*f*_0 to 210*f*_x of the sixth latch array 210*f* may invert at least one bit of the column address of the defective memory cell as the input thereto and latch the column address. An output of the master latch element among the plurality of latch elements included in each of the plurality of latch sets 210*e*_0 to 210*e*_x of the fifth latch array 210*e* may be a fifth enable signal.

The sixth compare logic 220*f* may receive the output of each of the plurality of latch sets 210*f*_0 to 210*f*_x of the sixth latch array 210*f* as an input thereto, may perform the NOR operation thereon, and may output a sixth enable signal based on the NOR operation result. The fifth compare logic 220e may receive the output of each of the latch elements except for the master latch of each of the plurality of latch sets 210e_0 to 210e_x of the fifth latch array 210e as an input thereto, may compare the received output with the external column address, and may output a fifth address match signal based on the comparing result. The sixth compare logic 220f may receive the output of each of the plurality of latch sets 210f_0 to 210f_x of the sixth latch array 210f in which at least one bit of the column address is inverted by at least one latch element as the input thereto, and may invert the input thereto, and may compare the inverting result with the external column address, and may output a sixth address match signal based on the comparing result.

In the operation of the memory device according to some embodiments, there may be an error in the output of each of the plurality of latch elements of any latch array. For example, the latch array may receive the default value of '000000' from the fuse array 180. However, an error occurs in the latch array that has received the default value, such that the latch array may output '001000'. The cause of this error may be, for example, a defect in at least one fuse element in the fuse array. Moreover, noise may occur while the address is being transmitted from the fuse array, thereby causing the incorrect address to be transmitted. When the external column address matches the output of the latch array, a non-defective memory cell may be repaired. Thus, the memory device may malfunction.

Each of the plurality of latch sets 210e_0 to 210e_x included in the fifth latch array 210e of the fifth column repair circuit 200e as shown in FIG. 14 may further include the master latch element. Accordingly, an error occurs in the output of the fifth latch array 210e such that the fifth latch array 210e outputs '001000'. However, in this situation, the fifth column repair circuit 200e may not perform the repair operation. The column decoder 200 may include the sixth column repair circuit 200f that operates in the complementary manner with the fifth column repair circuit 200e. As a result, although the space occupied by the repair circuit within the chip increases, the memory device with increased stability may be provided.

Figure 15:
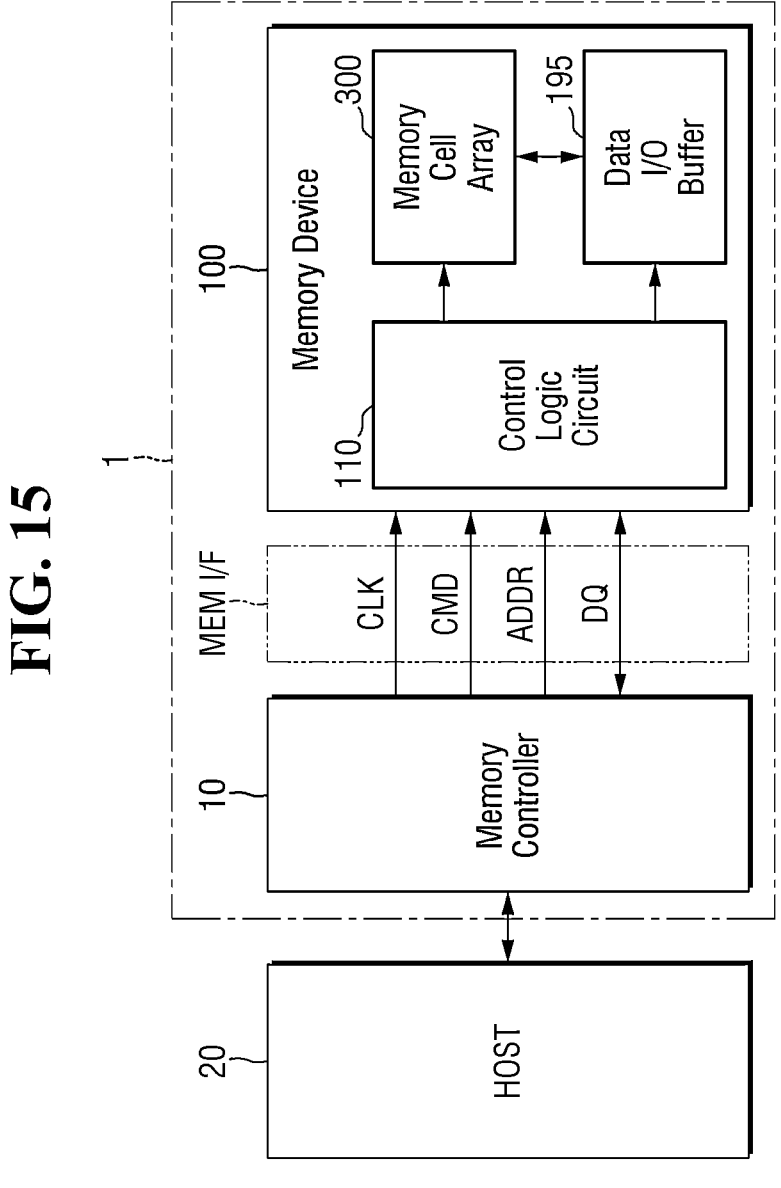
FIG. 15 is a block diagram of a memory system according to some embodiments.

FIG. 15 is a block diagram of a memory system according to some embodiments, which may include a memory controller 10 and at least one memory device 100. The memory device 100 may be the memory device 100 according to some embodiments of the present disclosure. The memory controller 10 may generally control the operation of the memory device 100. For example, the memory controller 10 may control data exchange between a host 20 and the memory device 100. For example, the memory controller 10 may control the memory device 100 in response to a request from the host 20, such that the data DQ may be written to the memory device or the data DQ may be read-out therefrom.

The host 20 may communicate with the memory system using an interface protocol such as Peripheral Component Interconnect Express (PCI-E), Advanced Technology Attachment (ATA), Serial ATA (SATA), Parallel ATA (PATA), Serial Attached SCSI (SAS), or Compute eXpress Link (CXL). Moreover, the interface protocol between the host 20 and the memory system 1 is not limited to the example as described above, and may be one of other interface protocols, such as USB (Universal Serial Bus), MMC (Multi-Media Card), ESDI (Enhanced Small Disk Interface), or IDE (Integrated Drive Electronics).

The memory controller 10 and the memory device 100 may communicate with each other via a memory interface MEM I/F. The memory controller 10 may apply a command CMD for controlling the memory device 100 thereto to control the operation of the memory device 100. In this regard, the memory device 100 may include dynamic memory cells. For example, the memory device 100 may include dynamic random access memory (DRAM), double data rate 4 (DDR4) synchronous DRAM (SDRAM), low power DDR4 (LPDDR4) SDRAM, or LPDDR5 SDRAM. However, embodiments according to the technical idea of the present disclosure are not limited thereto, and the memory device 100 may include a nonvolatile memory device. However, in this embodiment, an example in which the memory device 100 is embodied as a volatile memory device is described.

The memory controller 10 may transmit the clock signal CLK and the command CMD to the memory device 100. The memory controller 10 may provide the data DQ to the memory device 100 and may receive the data DQ from the memory device 100. The memory controller 10 may provide the address ADDR of the data DQ to the memory device 100 in order to write or read-out the data thereto or therefrom. The memory device 100 may include the control logic circuit 110, the address register 120 that receives the address ADDR, the memory cell array 300 that stores therein the data DQ, the column decoder 200, and the row decoder 160, etc.

Although embodiments of the present disclosure have been described with reference to the accompanying drawings, embodiments of the present disclosure are not limited to the above embodiments, but may be implemented in various different forms. A person skilled in the art may appreciate that the present disclosure may be practiced in other concrete forms without changing the technical spirit or essential characteristics of the present disclosure. Therefore, it should be appreciated that the embodiments as described above is not restrictive but illustrative in all respects.

What is claimed is:

1. A memory device, comprising:
a memory cell array having a plurality of normal memory cells and a plurality of redundant memory cells;
a fuse array configured to store a first column address of a first memory cell; and
a column decoder configured to receive the first column address, wherein the column decoder comprises a first column repair circuit including:
a first latch array having a plurality of latch elements and configured to receive the first column address and output first output bits, and
a first compare logic configured to receive the first output bits and a second column address, wherein the first compare logic is configured to:
output a first enable signal in response to at least one bit of the first output bits being logic 1,
compare the second column address with the first output bits and output a first address match signal, and
output a first column repair signal based on the first enable signal and the first address match signal.

2. The memory device of claim 1, wherein the first compare logic is configured to generate the first enable signal by performing a NOR operation on each bit of the first output bits.

3. The memory device of claim 1, wherein the first compare logic includes:
a plurality of XNOR gates configured to perform an XNOR operation on the first output bits the second column address, respectively; and a NOR gate configured to perform a NOR operation on each bit of the first output bits.

4. The memory device of claim 1, wherein a master bit stored in the fuse array is not transmitted to the first latch array.

5. The memory device of claim 1, wherein at least one of the plurality of latch elements of the first latch array is configured to invert an input and output the inverted input.

6. The memory device of claim 1, wherein the column decoder is configured to select among a plurality of column select lines associated with the normal memory cells and a plurality of spare column select lines associated with the redundant memory cells, wherein each of the plurality of column select lines and the plurality of spare column select lines is divided into a plurality of segments, wherein the first latch array includes a plurality of latch sets and a number of the plurality of latch sets is equal to a number of the plurality of segments, and wherein each of the plurality of latch sets includes the plurality of latch elements.

7. The memory device of claim 1, wherein the fuse array is further configured to store a third column address of second memory cell;

wherein the column decoder further includes a second column repair circuit including:

a second latch array including a plurality of latch elements configured to receive the third column address and output second output bits, and a second compare logic configured to receive the second output bits a fourth column address;

wherein the first column repair circuit and the second column repair circuit are different from each other;

wherein the second compare logic is configured to:

output a second enable signal in response to at least one bit of the second output bits being logic 1, compare the fourth column address with the second output bits and output a second address match signal, output a second column repair signal based on the second enable signal and the second address match signal.

8. The memory device of claim 7, wherein the first compare logic is configured to generate the first enable signal by performing a NOR operation on each bit of the first output bits; and wherein the second compare logic is configured to generate the second enable signal by performing a NOR operation on each bit of the second output bits.

9. The memory device of claim 7, wherein a master bit of the first memory cell stored in the fuse array is not transmitted to the plurality of latch elements of the first latch array; and wherein a master bit of the second memory cell stored in the fuse array is not transmitted to the plurality of latch elements of the second latch array.

10. The memory device of claim 7, wherein the column decoder is configured to select among a plurality of column select lines associated with the normal memory cells and a plurality of spare column select lines associated with the redundant memory cells, wherein each of the plurality of column select lines and the plurality of spare column select lines is divided into a plurality of segments, wherein each of the first and second latch arrays includes a plurality of latch sets and a number of the plurality of latch sets is equal to a number of the plurality of segments, and wherein each of the plurality of latch sets includes the plurality of latch elements.

11. The memory device of claim 7, wherein each of the first and second compare logics includes:

a plurality of XNOR gates configured to perform an XNOR operation on the first and second output bits and the second and fourth column address, respectively; and a NOR gate configured to perform a NOR operation on each bit of the second output bits.

12. The memory device of claim 7, wherein at least one of the plurality of latch elements of the first latch array is configured to invert an input and output the inverted input.

13. The memory device of claim 1, wherein the fuse array is configured to further store a third column address and a master bit of a second memory cell;

wherein the column decoder further includes a second column repair circuit including: a second latch array including a plurality of latch elements configured to receive the third column address and output second output bits, a master latch element configured to receive and output the master bit of the second memory cell, and a second compare logic configured to receive the second output bits and a fourth column address, wherein the first column repair circuit and the second column repair circuit are different from each other; and wherein the second compare logic is configured to:

output a second enable signal based on an output of the master latch element, compare the fourth column address with the second output bits and output a second address match signal, output a second column repair signal based on the second enable signal and the second address match signal.

14. The memory device of claim 13, wherein the first compare logic is configured to generate the first enable signal by performing a NOR operation on each bit of the first output bits; and wherein the second compare logic is configured to use the output of the master latch element as the second enable signal.

15. The memory device of claim 13, wherein a master bit of the first memory cell stored in the fuse array is not transmitted to the first latch array.

16. The memory device of claim 13, wherein the column decoder is configured to select among a plurality of column select lines associated with the normal memory cells and a plurality of spare column select lines associated with the redundant memory cells, wherein each of the plurality of column select lines and the plurality of spare column select lines is divided into a plurality of segments, wherein each of the first and second latch arrays includes a plurality of latch sets and a number of the plurality of latch sets is equal to a number of the plurality of segments, wherein each of the plurality of latch sets of the first latch array includes the plurality of latch elements, and wherein each of the plurality of latch sets of the second latch array includes the plurality of latch elements and the master latch element.

17. The memory device of claim 13, wherein each of the first and second compare logics includes a plurality of XNOR gates configured to perform an XNOR operation on the first and second output bits and the second and fourth column address, respectively; and wherein the first compare logic includes a NOR gate configured to perform a NOR operation on each bit of the first output bits.

18. The memory device of claim 13, wherein at least one of the plurality of latch elements of the first latch array is configured to invert an input thereto and output the inverted input.

19. A method for operating a memory device, comprising:

transmitting a first column address of a first memory cell stored in a fuse array to a first latch array of a first column repair circuit;

outputting a first enable signal in response to at least one of output bits of the first latch array being logic 1;

comparing the output bits of the first latch array with a second column address and outputting a first address match signal based on a result of the comparing; and outputting a first column repair signal based on the first enable signal and the first address match signal.

20. A memory system, comprising:

a memory controller configured to transmit an address of each of read data and write data to a memory device; and the memory device configured to repair a normal memory cell using a redundant memory cell, wherein the memory device includes:

a memory cell array including a plurality of normal memory cells, and a plurality of redundant memory cells;

a fuse array configured to store a first column address of a first memory cell;

an address register configured to receive an address from the memory controller and output a second column address; and a column decoder configured to receive the first and second column address;

wherein the column decoder comprises a first column repair circuit including:

a first latch array having a plurality of latch elements configured to receive the first column address and output first output bits, and a first compare logic configured to receive the first output bits and the second column address; and wherein the first compare logic is configured to:

output a first enable signal in response to at least one bit of the first output bits being logic 1, compare the second column address with the first output bits and output a first address match signal, output a first column repair signal based on the first enable signal and the first address match signal.

* * * * *